(12) United States Patent
Kan et al.

(10) Patent No.: US 9,813,049 B2
(45) Date of Patent: Nov. 7, 2017

(54) COMPARATOR INCLUDING A MAGNETIC TUNNEL JUNCTION (MTJ) DEVICE AND A TRANSISTOR

(71) Applicant: QUALCOMM Incorporated, San Diego, CA (US)

(72) Inventors: Jimmy Kan, San Diego, CA (US); Manu Rastogi, San Diego, CA (US); Kangho Lee, San Diego, CA (US); Seung Hyuk Kang, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 14/824,460

(22) Filed: Aug. 12, 2015

(65) Prior Publication Data

US 2017/0047912 A1 Feb. 16, 2017

(51) Int. Cl.
| | | |
|---|---|---|
| H03K 5/153 | (2006.01) | |
| H03K 3/3565 | (2006.01) | |
| H03K 3/45 | (2006.01) | |
| H03K 3/012 | (2006.01) | |
| H03K 5/24 | (2006.01) | |

(52) U.S. Cl.
CPC .......... *H03K 3/3565* (2013.01); *H03K 3/012* (2013.01); *H03K 3/45* (2013.01); *H03K 3/455* (2013.01); *H03K 5/2409* (2013.01); *H03K 5/2472* (2013.01)

(58) Field of Classification Search
CPC ............. H03K 3/2893; H03K 3/3565; H03K 3/02337; H03K 3/0377; H03K 3/011; H03K 5/2481; H03K 5/249; H03K 5/08; H03K 5/24; G01R 19/16519

USPC ............................... 327/77, 205, 206
See application file for complete search history.

(56) References Cited

U.S. PATENT DOCUMENTS

| | | | |
|---|---|---|---|
| 6,215,342 B1 * | 4/2001 | Morrill ..................... G06F 1/24 327/143 |
| 6,891,212 B2 | 5/2005 | Sharma et al. |
| 6,903,966 B2 | 6/2005 | Sakata et al. |
| 8,681,034 B2 * | 3/2014 | Marukame ............. H01L 43/08 341/155 |
| 8,779,824 B2 | 7/2014 | Wu et al. |
| 9,000,819 B1 * | 4/2015 | Nardi ................. H03K 3/02335 327/205 |
| 9,189,201 B2 * | 11/2015 | Jacobson ............... G06F 7/588 |

(Continued)

FOREIGN PATENT DOCUMENTS

| | | |
|---|---|---|
| EP | 2163984 A1 | 3/2010 |
| WO | 2008040561 A2 | 4/2008 |
| WO | 2010019881 A1 | 2/2010 |

OTHER PUBLICATIONS

Mukherjee S.S., et al., "A Stable SPICE Macro-Model for Magnetic Tunnel Junctions for Applications in Memory and Logic Circuits," IEEE Transactions on Magnetics, Sep. 2009, vol. 45 (9), pp. 3260-3268.

(Continued)

*Primary Examiner* — Quan Tra

(57) ABSTRACT

A particular apparatus includes a magnetic tunnel junction (MTJ) device and a transistor. The MTJ device and the transistor are included in a comparator that has a hysteresis property associated with multiple transition points that correspond to magnetic switching points of the MTJ device.

30 Claims, 6 Drawing Sheets

(56) References Cited

U.S. PATENT DOCUMENTS

| | | | |
|---|---|---|---|
| 2003/0184460 A1 | 10/2003 | Johnson et al. | |
| 2006/0013038 A1* | 1/2006 | Kaiyang | G11C 11/15 365/171 |
| 2008/0111593 A1* | 5/2008 | Jang | H03K 17/223 327/143 |
| 2008/0238475 A1 | 10/2008 | Chua-Eoan et al. | |
| 2009/0121259 A1 | 5/2009 | Iben et al. | |
| 2010/0258887 A1 | 10/2010 | Zhu et al. | |
| 2010/0301957 A1 | 12/2010 | Park et al. | |
| 2012/0015166 A1* | 1/2012 | Kelber | B82Y 30/00 428/215 |

OTHER PUBLICATIONS

International Search Report and Written Opinion—PCT/US2016/042016—ISA/EPO—dated Oct. 20, 2016.

\* cited by examiner

COMPARATOR INCLUDING A MAGNETIC TUNNEL JUNCTION (MTJ) DEVICE AND A TRANSISTOR

I. FIELD

The present disclosure is generally related to a comparator including a magnetic tunnel junction (MTJ) device and a transistor.

II. DESCRIPTION OF RELATED ART

Advances in technology have resulted in smaller and more powerful computing devices. For example, a variety of portable personal computing devices, including wireless telephones such as mobile and smart phones, tablets and laptop computers, are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

A Schmitt trigger is a comparator with a hysteresis property that is associated with multiple transition points. For example, an output of the comparator may change from a first output to a second output when an input voltage increases above a first threshold voltage. The output of the comparator may change from the second output to the first output when the input voltage decreases below a second threshold voltage. The Schmitt trigger generally includes several components (e.g., more than 6 transistors and several resistors). Each of the components occupies physical space. Each of the components may have dynamic power consumption. The transistors may also have static power dissipation. The output of the comparator may change after a delay subsequent to the input voltage increasing above the first threshold voltage or decreasing below the second threshold voltage. The transition points of the Schmitt trigger may be based on device dimensions and process parameters. That is, the transition points of the Schmitt trigger may not be tunable after the Schmitt trigger is manufactured, such as during use of the Schmitt trigger. For example, a user of the Schmitt trigger or a device that includes the Schmitt trigger may be unable to tune the transition points (or threshold voltages) of the Schmitt trigger during operation.

III. SUMMARY

The present disclosure describes a comparator that includes a magnetic tunnel junction (MTJ) device and a transistor. The comparator has a hysteresis property associated with multiple transition points that correspond to magnetic switching points of the MTJ device. The comparator may operate as a smaller, more energy-efficient, and more tunable Schmitt trigger. For example, an input of the comparator may correspond to an input of the MTJ device. An output of the MTJ device may change from a first particular voltage to a second particular voltage when a voltage applied to the input of the MTJ device increases above a first threshold voltage. The output of the MTJ device may change from the second particular voltage to the first particular voltage when the voltage applied to the input of the MTJ device decreases below a second threshold voltage.

The comparator, which includes the above-described MTJ device and transistor, may operate as a voltage amplifier. For example, the first voltage, the second voltage, or both, provided at the output of the comparator may be higher than the voltage applied to the input of the comparator.

To enable tuning of the comparator during operation, a field line (e.g., a conductive line) having a flux concentrating layer may be added to the comparator. The field line may include conductive material, such as copper, aluminum, or other metals. The flux concentrating layer may include a nickel-iron (NiFe) alloy or other magnetic materials. The field line may generate a magnetic field when current is applied to the field line. The magnetic switching points of the MTJ device may vary based on the current applied to the field line. For example, the magnetic switching points of the MTJ device may vary based on a magnitude of the magnetic field generated by the field line. Thus, the first threshold voltage and the second threshold voltage of the comparator may correspond to the magnetic switching points and may be tuned after manufacture of the comparator (e.g., during operation) by modifying a current applied to the field line.

In a particular aspect, an apparatus includes a magnetic tunnel junction (MTJ) and a transistor. The MTJ and the transistor are included in a comparator that has a hysteresis property associated with multiple transition points that correspond to magnetic switching points of the MTJ device.

In another particular aspect, a method of operation of a comparator includes switching from outputting a first voltage to outputting a second voltage when a voltage applied to an input of the comparator increases above a first threshold voltage level. The comparator includes a magnetic tunnel junction (MTJ) device coupled to a transistor. The first threshold voltage level corresponds to a first switching point of magnetic switching points of the MTJ device. The output of the comparator corresponds to a second output of the transistor. The method also includes switching from outputting the second voltage to outputting the first voltage when the voltage applied to the input of the comparator decreases below a second threshold voltage level. The second threshold voltage level corresponds to a second switching point of the magnetic switching points.

In another particular aspect, a method of operation of a comparator includes switching from providing a first particular voltage at a first output of a magnetic tunnel junction (MTJ) device of the comparator to providing a second particular voltage at the first output when a voltage applied to an input of the MTJ device increases above a first threshold voltage level. The first threshold voltage level corresponds to a first switching point of magnetic switching points of the MTJ device. The first output is coupled to a gate of a transistor of the comparator. The method also includes switching from providing the second particular voltage at the first output to providing the first particular voltage at the first output when the voltage applied to the input decreases below a second threshold voltage level. The second threshold voltage level corresponds to a second switching point of the magnetic switching points.

One particular advantage provided by at least one of the disclosed embodiments is an MTJ-based comparator that includes fewer components than a Schmitt trigger-based comparator that does not include an MTJ device. For example, the disclosed MTJ-based comparator may include an MTJ device, a single transistor, and a single resistor. In contrast, a Schmitt trigger-based comparator may include at least two transistors and several resistors, and may thus use more space and power than the described MTJ-based comparator.

Another particular advantage provided by at least one of the disclosed embodiments is that the MTJ-based comparator may be tunable during use. For example, transition points of the MTJ-based comparator may be tuned by modifying a current applied to a field line of the comparator. Thus, a single tunable MTJ-based comparator as described herein may be used instead of multiple larger, more power-consuming Schmitt trigger-based comparators for different switching points.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
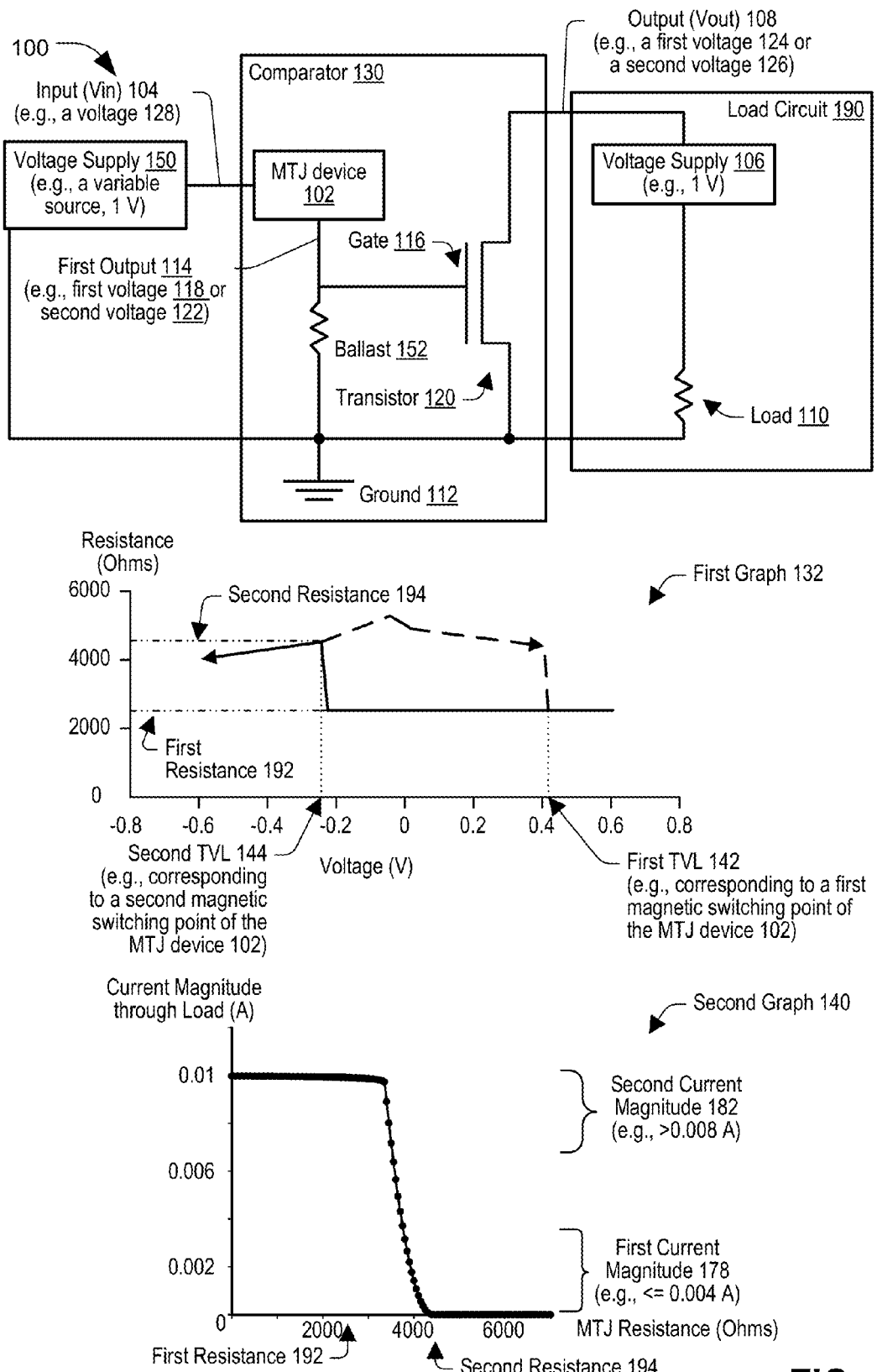
FIG. 1 is a block diagram of a particular illustrative aspect of a device that includes a comparator that includes a magnetic tunnel junction (MTJ) device and a transistor.

Referring to FIG. 1, a particular illustrative embodiment of a device is disclosed and generally designated 100. The device 100 includes a comparator 130. The comparator 130 may be external to a memory component of the device 100. The comparator 130 may be coupled to a capacitor, a diode bridge circuit, a second comparator, or a combination thereof.

The comparator 130 may have an input (Vin) 104 and an output (Vout) 108. The comparator 130 may be configured to compare a voltage 128 applied to the input 104 to one or more threshold voltage levels, as described herein. The input 104 may be coupled to a voltage supply 150 (e.g., a variable source power supply). The comparator 130 includes a magnetic tunnel junction (MTJ) device 102 coupled to a transistor 120 (e.g., a metal-oxide semiconductor (MOS) transistor or a bipolar junction transistor (BJT)). The input 104 may be an input of the MTJ device 102. A first output 114 of the MTJ device 102 may be coupled to a gate 116 of the transistor 120. The first output 114 of the MTJ device 102 may also be coupled, via a resistor (e.g., a ballast resistor 152), to a second voltage supply (e.g., ground 112). An output of the transistor 120 may correspond to the output 108. The transistor 120 may be coupled to a load circuit 190. The load circuit 190 may include a voltage supply 106, a load 110 (e.g., a resistor), or both. The transistor 120 may be coupled to the voltage supply 106, the load 110, or both.

The MTJ device 102 may include multiple magnetic switching points (e.g., a first magnetic switching point and a second magnetic switching point). Each of the magnetic switching points may correspond to a particular threshold voltage level. For example, the first magnetic switching point may correspond to a first threshold voltage level 142.

To illustrate, the MTJ device 102 may have a free layer that is configured to switch from having a first magnetic orientation (e.g., anti-parallel with respect to a fixed/pinned layer of the MTJ device 102) to having a second magnetic orientation (e.g., parallel with respect to the fixed/pinned layer of the MTJ device 102) in response to the voltage 128 applied to the input 104 increasing above the first threshold voltage level 142. The second magnetic switching point may correspond to a second threshold voltage level 144. For example, the free layer of the MTJ device 102 may be configured to switch from having the second magnetic orientation (e.g., parallel with respect to the fixed/pinned layer of the MTJ device 102) to having the first magnetic orientation (e.g., anti-parallel with respect to the fixed/pinned layer of the MTJ device 102) in response to the voltage 128 applied to the input 104 decreasing below the second threshold voltage level 144. The first threshold voltage level 142 may be higher than the second threshold voltage level 144, as shown in FIG. 1. In an alternate implementation, the first threshold voltage level 142 may be lower than the second threshold voltage level 144.

The MTJ device 102 may be configured to transition from providing a first voltage 118 to providing a second voltage 122 at the first output 114 in response to the voltage 128 applied to the input 104 increasing above the first threshold voltage level 142. As another example, the MTJ device 102 may be configured to transition from providing the second voltage 122 to providing the first voltage 118 at the first output 114 in response to the voltage 128 applied to the input 104 decreasing below the second threshold voltage level 144.

FIG. 1 includes a first graph 132. The first graph 132 corresponds to an illustrative example of variance of resistance of the MTJ device 102 based on the voltage 128 applied to the input 104. As the voltage 128 applied to the input 104 increases above the first threshold voltage level (TVL) 142 (e.g., approximately 0.42 V), a resistance of the MTJ device 102 may transition from a second resistance 194 (e.g., above 3500 Ohms) to a first resistance 192 (e.g., approximately 2200 Ohms). For example, a free layer of the MTJ device 102 may switch from having a first magnetic orientation (e.g., anti-parallel with respect to a pinned layer of the MTJ device 102) to having a second magnetic orientation (e.g., parallel with respect to the pinned layer of the MTJ device 102). The second resistance 194 may correspond to the first magnetic orientation and the first resistance 192 may correspond to the second magnetic orientation.

As the voltage 128 applied to the input 104 decreases below the second TVL 144 (e.g., −0.24 V), the resistance of the MTJ device 102 may transition from the first resistance 192 to the second resistance 194. For example, the free layer of the MTJ device 102 may switch from having the second magnetic orientation (e.g., parallel with respect to the pinned layer of the MTJ device 102) to having the first magnetic orientation (e.g., anti-parallel with respect to a pinned layer of the MTJ device 102). The MTJ device 102 may provide the first voltage 118 at the first output 114 when the resistance of the MTJ device 102 corresponds to the second resistance 194. The MTJ device 102 may provide the second voltage 122 at the first output 114 when the resistance of the MTJ device 102 corresponds to the first resistance 192.

The comparator 130 may be configured to output a first voltage 124 when the MTJ device 102 provides the first voltage 118 at the first output 114 of the MTJ device 102 and may be configured to output a second voltage 126 when the MTJ device 102 provides the second voltage 122 at the first output 114 of the MTJ device 102. For example, the transistor 120 may be configured to provide the first voltage 124 at the output 108 when the first voltage 118 is applied to the gate 116 of the transistor 120. As another example, the transistor 120 may be configured to provide the second voltage 126 at the output 108 when the second voltage 122 is applied to the gate 116. The first voltage 124 may correspond to a first logical value (e.g., 0) and the second voltage 126 may correspond to a second logical value (e.g., 1). The first voltage 124, the second voltage 126, or both, may be higher than the voltage 128 applied to the input 104. The comparator 130 may thus function as a voltage amplifier.

FIG. 1 also includes a second graph 140. The second graph 140 corresponds to an illustrative example of variance of current magnitude through the load 110 based on the resistance of the MTJ device 102. A current through the load 110 may have a first current magnitude 178 (e.g., less than or equal to approximately 0.004 amperes) when the resistance of the MTJ device 102 corresponds to the second resistance 194. The current through the load 110 may have a second current magnitude 182 (e.g., greater than approximately 0.008 amperes) when the resistance of the MTJ device 102 corresponds to the first resistance 192.

It should be understood that the values for the first TVL 142, the second TVL 144, the first resistance 192, the second resistance 194, the first current magnitude 178, and the second current magnitude 182 shown in FIG. 1 are illustrative. In a particular implementation, one or more of the first TVL 142, the second TVL 144, the first resistance 192, the second resistance 194, the first current magnitude 178, the second current magnitude 182, or a combination thereof, may correspond to values that differ from values shown in FIG. 1.

The hysteresis property of the comparator 130, as illustrated by the first graph 132, may enable the comparator 130 to function as a Schmitt trigger. For example, the comparator 130 may not transition from outputting the first voltage 124 to outputting the second voltage 126 until the voltage 128 applied to the input 104 increases above the first threshold voltage level 142. The comparator 130 may not transition from outputting the second voltage 126 to outputting the first voltage 124 until the voltage 128 applied to the input 104 decreases below the second threshold voltage level 144.

The comparator 130 may include a single transistor (e.g., the transistor 120), a single resistor (e.g., the ballast resistor 152), and the MTJ device 102. The comparator 130 may use less space, power, or both, compared to a Schmitt trigger that includes more components (e.g., at least two transistors and several resistors). For example, a Schmitt trigger-based comparator may include active components (e.g., at least two transistors and several resistors) that use power to maintain a current or voltage of an output of the active components. The MTJ-based comparator 130 includes a passive component (e.g., the MTJ device 102) that maintains a current of an output of the MTJ device 102 without using power. The MTJ-based comparator 130 may have no static power consumption. The MTJ-based comparator 130 may thus use less power than the Schmitt-trigger based comparator. The MTJ-based comparator 130 may use less space (e.g., approximately 40 nanometer diameter in one example) than a Schmitt trigger-based comparator.

Further, the MTJ-based comparator 130 may respond to a change in a voltage applied to an input (e.g., the MTJ may "switch") faster than a Schmitt trigger-based comparator. For example, a response time of the MTJ-based comparator 130 may be based on a switching speed of the MTJ device 102. A response time of the Schmitt trigger-based comparator may be based on a response speed of a large number of circuit elements (e.g., multiple transistors and resistors). In one example, the MTJ-based comparator 130 has a response speed between 500 picoseconds (ps) and 1 nanosecond (ns).

Figure 2:
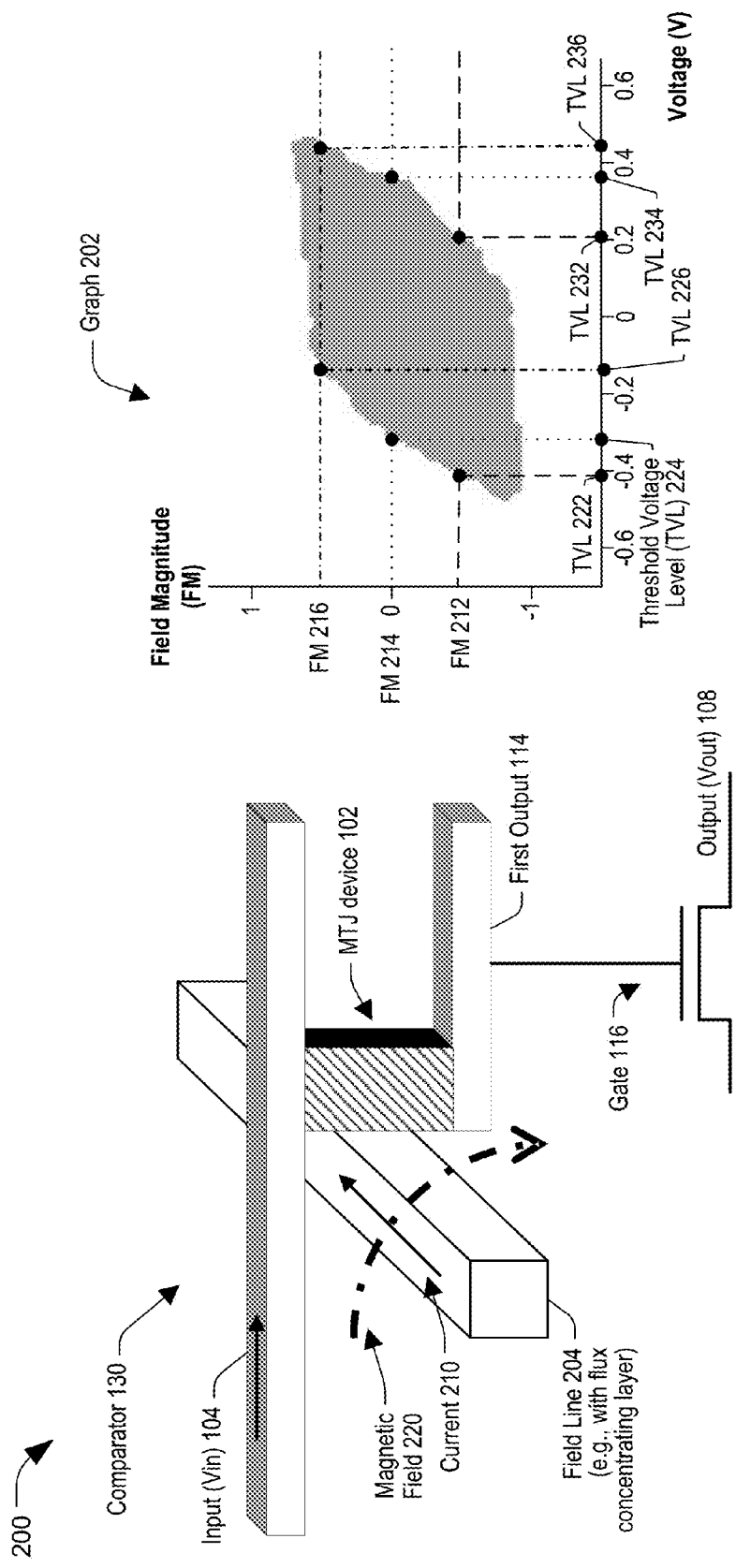
FIG. 2 is a diagram illustrating another aspect of the comparator of FIG. 1.

Referring to FIG. 2, a diagram of an illustrative aspect of a comparator is shown and generally designated 200. The diagram 200 includes the comparator 130 and a graph 202.

The comparator 130 may include a field line 204 (e.g., a conductive line). The field line 204 may include conductive material (e.g., copper, aluminum, or other metals), a flux concentrating layer, or both. The flux concentrating layer may include a nickel-iron (NiFe) alloy or other magnetic materials. The field line 204 may be proximate to the MTJ device 102. The magnetic switching points of the MTJ device 102 may vary based on a current 210 applied to the field line 204. For example, a magnitude and direction of a magnetic field 220 generated by the field line 204 may be based on a magnitude and direction of the current 210 applied to the field line 204. The magnetic switching points of the MTJ device 102 may vary based on the magnitude of the magnetic field 220. Modifying the current 210 applied to the field line 204 may shift the magnetic switching points. A shift in the magnetic switching points of the MTJ device 102 may correspond to a shift in the threshold voltages (e.g., the first threshold voltage level 142, the second threshold voltage level 144, or both).

The graph 202 illustrates an exemplary relationship between the magnitude of the magnetic field 220 generated by the field line 204 when the current 210 is applied to the field line 204 and threshold voltages of the MTJ device 102. For example, field magnitude (FM) 214 may correspond to a first level (e.g., magnitude) of the current 210, FM 216 may correspond to a second level (e.g., magnitude) of the current 210, FM 212 may correspond to a third level (e.g., magnitude) of the current 210, or a combination thereof. When the first level of current is applied, the first threshold voltage level 142 may correspond to a threshold voltage level (TVL) 234 (e.g., 0.34 V) and the second threshold voltage level 144 may correspond to a TVL 224 (e.g., −0.31 volts (V)).

When the second level of current is applied, the first threshold voltage level 142 may correspond to a TVL 236 (e.g., 0.43 V) and the second threshold voltage level 144 may correspond to a TVL 226 (e.g., −0.12 V). The TVL 226 may be higher than the TVL 224, and the TVL 236 may be higher than the TVL 234.

When the third level of current is applied, the first threshold voltage level 142 may correspond to a TVL 232 (e.g., 0.20 V) and the second threshold voltage level 144 may correspond to a TVL 222 (e.g., −0.38 V). The TVL 222 may be lower than the TVL 224, and the TVL 232 may be lower than the TVL 234. It should be understood that the values for the TVLs 222-236 and the FMs 212-216 shown in FIG. 2 are illustrative. In a particular implementation, one or more of the TVLs 222-236, one or more of the FMs 212-216, or a combination thereof, may correspond to values that differ from values shown in FIG. 2. The values for the TVLs 222-236 may be dependent on physical properties of the MTJ device 102.

Thus, as shown in FIG. 2, the first threshold voltage level 142 and the second threshold voltage level 144 may be tuned by changing a current level (e.g., magnitude) of the current 210 applied to the field line 204. For example, to increase the first threshold voltage level 142 and the second threshold voltage level 144, the level of the current 210 may be increased. Alternatively, to decrease the first threshold voltage level 142 and the second threshold voltage level 144, the level of the current 210 may be decreased.

The comparator 130 may thus operate as a Schmitt trigger with tunable hysteresis. For example, transition points of the comparator 130 corresponding to threshold voltage levels of the MTJ device 102 may be tuned by increasing or decreasing a current level of the current 210 applied to the field line 204. Incorporation of the field line 204 into the comparator 130 may thus enable the single MTJ-based comparator 130 to support multiple threshold voltage levels, as compared to using several Schmitt trigger-based comparators that are not tunable once manufactured.

Figure 3:
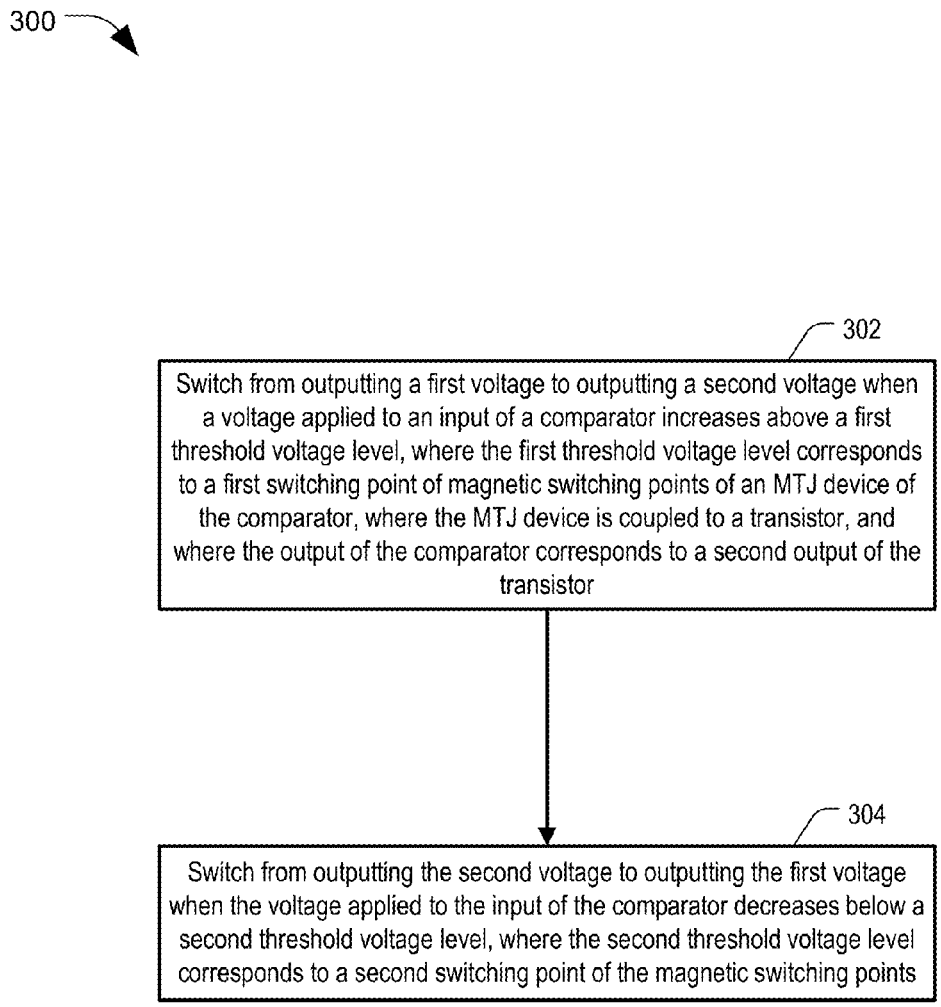
FIG. 3 is a flow chart of a particular illustrative aspect of a method of operation of the comparator of FIG. 1.

Referring to FIG. 3, an illustrative aspect of a method of operation is shown and generally designated 300. The method 300 may be performed by the comparator 130 of FIG. 1.

The method 300 includes switching from outputting a first voltage to outputting a second voltage when a voltage applied to an input of a comparator increases above a first threshold voltage level, at 302. For example, the comparator 130 may switch from outputting the first voltage 124 to outputting the second voltage 126 when the voltage 128 applied to the input 104 of the comparator 130 increases above the first threshold voltage level 142, as described with reference to FIG. 1. The first threshold voltage level 142 may correspond to the first magnetic switching point of the MTJ device 102, as described with reference to FIG. 1. For example, the first magnetic switching point may correspond to a transition of a free layer of the MTJ device 102 from having a parallel magnetic orientation to having an anti-parallel magnetic orientation (or vice versa) relative to a pinned layer of the MTJ device 102. The MTJ device 102 may be coupled to the transistor 120. The output 108 of the comparator 130 may correspond to an output of the transistor 120.

The method 300 also includes switching from outputting the second voltage to outputting the first voltage when the voltage applied to the input of the comparator decreases below a second threshold voltage level, at 304. For example, the comparator 130 may switch from outputting the second voltage 126 to outputting the first voltage 124 when the voltage 128 decreases below the second threshold voltage level 144. The second threshold voltage level 144 may correspond to the second magnetic switching point of the MTJ device 102. For example, the second magnetic switching point may correspond to a transition of the free layer of the MTJ device 102 from having the anti-parallel magnetic orientation to having the parallel magnetic orientation (or vice versa) relative to the pinned layer of the MTJ device 102.

The method 300 may thus enable the comparator 130 that includes the MTJ device 102 and the transistor 120 to operate as a Schmitt trigger. For example, the output 108 may not switch from providing the first voltage 124 to providing the second voltage 126 until the voltage 128 increases above the first threshold voltage level 142 and may not switch from providing the second voltage 126 to providing the first voltage 124 until the voltage 128 decreases below the second threshold voltage level 144.

Figure 4:
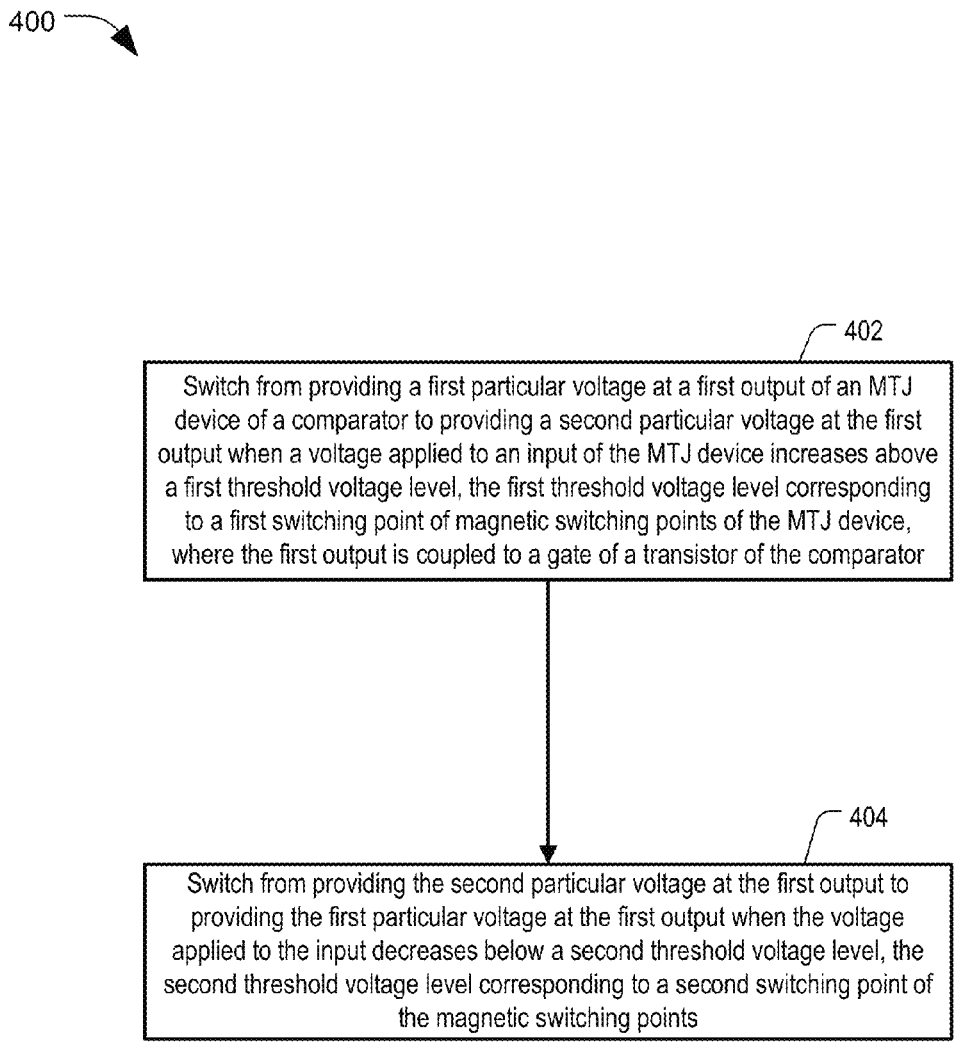
FIG. 4 is a flow chart of another particular illustrative aspect of a method of operation of the comparator of FIG. 1.

Referring to FIG. 4, an illustrative aspect of a method of operation is shown and generally designated 400. The method 400 may be performed by the comparator 130 of FIG. 1.

The method 400 includes switching from providing a first particular voltage at a first output of an MTJ device of a comparator to providing a second particular voltage at the first output when a voltage applied to an input of the MTJ device increases above a first threshold voltage level, at 402. For example, the MTJ device 102 may switch from providing the first voltage 118 at the first output 114 to providing the second voltage 122 at the first output 114 when the voltage 128 applied to the input 104 increases above the first threshold voltage level 142, as described with reference to FIG. 1. The first threshold voltage level 142 may correspond to the first magnetic switching point of the MTJ device 102. For example, the first magnetic switching point may correspond to a transition of a free layer of the MTJ device 102 from having a parallel magnetic orientation to having an anti-parallel magnetic orientation (or vice versa) relative to a pinned layer of the MTJ device 102. The first output 114 may be coupled to the gate 116 of the transistor 120 of the comparator 130.

The method 400 also includes switching from providing the second particular voltage at the first output to providing the first particular voltage at the first output when the voltage applied to the input decreases below a second threshold voltage level, at 404. For example, the MTJ device 102 may switch from providing the second voltage 122 at the first output 114 to providing the first voltage 118 at the first output 114 when the voltage 128 applied to the input 104 decreases below the second threshold voltage level 144, as described with reference to FIG. 1. The second threshold voltage level 144 may correspond to the second magnetic switching point of the MTJ device 102. For example, the second magnetic switching point may correspond to a transition of the free layer of the MTJ device 102 from having the anti-parallel magnetic orientation to having the parallel magnetic orientation (or vice versa) relative to the pinned layer of the MTJ device 102.

The method 400 may thus enable the comparator 130 that includes the MTJ device 102 and the transistor 120 to operate as a Schmitt trigger. For example, the first output 114 may not switch from providing the first voltage 118 to providing the second voltage 122 to the gate 116 until the voltage 128 increases above the first threshold voltage level 142 and may not switch from providing the second voltage 122 to providing the first voltage 118 to the gate 116 until the voltage 128 decreases below the second threshold voltage level 144. The output 108 may provide the second voltage 126 when the second voltage 122 is applied to the gate 116 and may provide the first voltage 124 when the first voltage 118 is applied to the gate 116.

Figure 5:
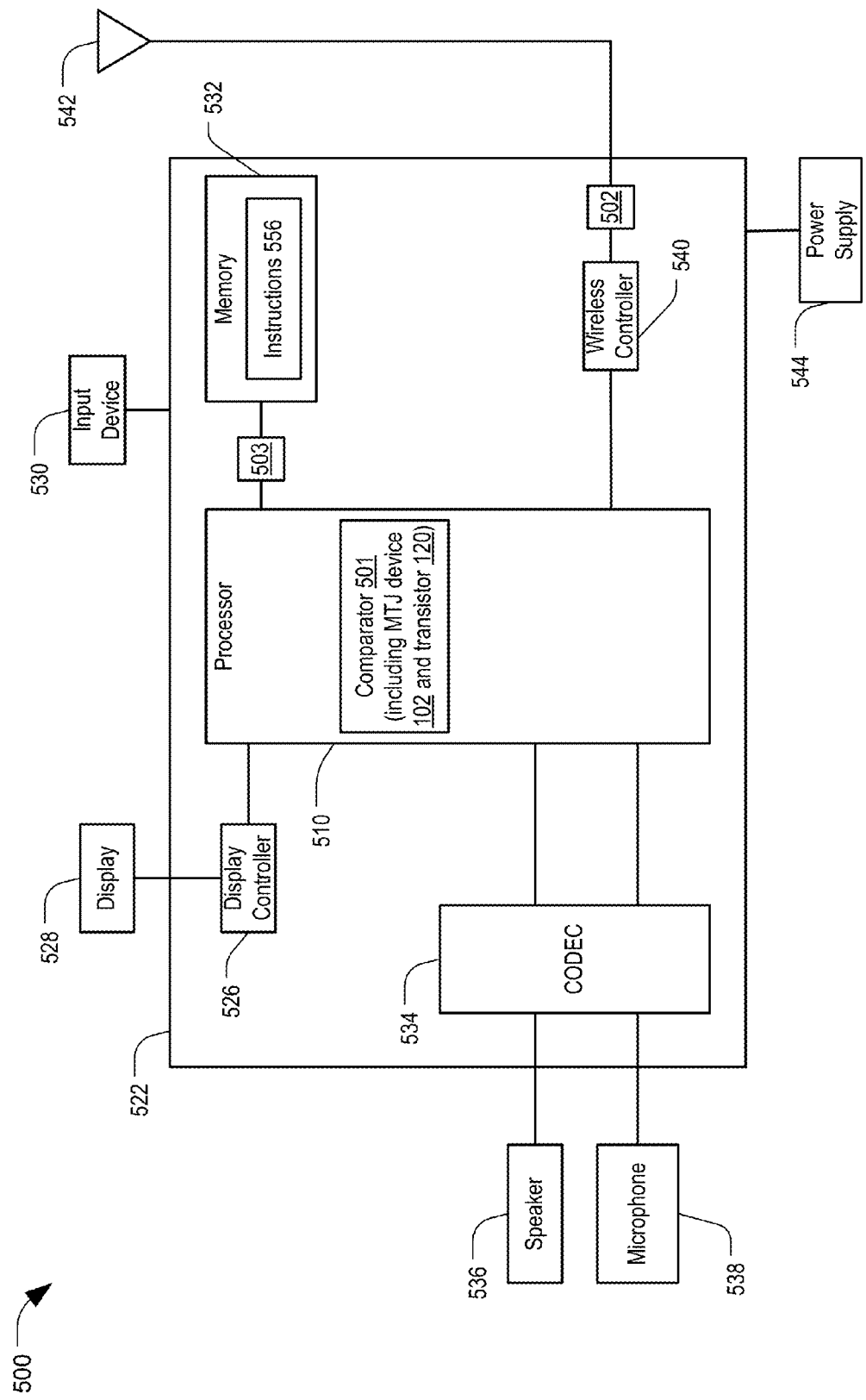
FIG. 5 is a block diagram of portable device including a comparator that includes an MTJ device and a transistor.

Referring to FIG. 5, a block diagram of a particular illustrative embodiment of a wireless communication device is depicted and generally designated 500. The wireless communication device 500 includes a processor 510, such as a digital signal processor (DSP), coupled to a memory 532 (e.g., a random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art). In some examples, the processor 510 may include at least one comparator 501. The comparator 501 may include the MTJ device 102 and the transistor 120. In a particular aspect, the wireless communication device 500 may correspond to the device 100 of FIG. 1.

FIG. 5 also shows a display controller 526 that is coupled to the processor 510 and to a display 528. A coder/decoder (CODEC) 534 may also be coupled to the processor 510. A speaker 536 and a microphone 538 may be coupled to the CODEC 534.

FIG. 5 also indicates that a wireless controller 540 may be coupled to the processor 510 and may be further coupled to an antenna 542. In some examples, the wireless controller 540 may be coupled, via at least one comparator 502, to the antenna 542. In some examples, the processor 510 may be coupled to the memory 532 via at least one comparator 503. One or more of the comparators 501-503 may correspond to an MTJ-based comparator, such as the comparator 130 of FIGS. 1-2. One or more of the comparators 130 and 501-503, which may operate as Schmitt triggers, may be used for a variety of applications, such as signal conditioning, radio-frequency (RF) signal processing, memory operations, etc.

In a particular embodiment, the processor 510, the display controller 526, the memory 532, the CODEC 534, and the wireless controller 540 are included in a system-in-package or system-on-chip device 522. In a particular embodiment, an input device 530 and a power supply 544 are coupled to the system-on-chip device 522. Moreover, in a particular embodiment, as illustrated in FIG. 5, the display 528, the input device 530, the speaker 536, the microphone 538, the antenna 542, and the power supply 544 are external to the system-on-chip device 522. However, each of the display 528, the input device 530, the speaker 536, the microphone 538, the antenna 542, and the power supply 544 may be coupled to a component of the system-on-chip device 522, such as an interface or a controller.

In conjunction with the described embodiments, an apparatus is disclosed that may include means for comparing an input voltage to a threshold voltage, the means for comparing including a magnetic tunnel junction (MTJ) device and a transistor. For example, the means for comparing may include the comparator 130, one or more other devices or circuits configured to compare an input voltage to a threshold voltage and including an MTJ device and a transistor, or any combination thereof. The comparator 130 may have a hysteresis property associated with multiple transition points that correspond to magnetic switching points of the MTJ device 102.

The apparatus may also include means for shifting the magnetic switching points. For example, the means for shifting may include the field line 204 of FIG. 2, one or more other devices or circuits configured to shift the magnetic switching points, or a combination thereof.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then integrated into electronic devices, as described further with reference to FIG. 6.

Figure 6:
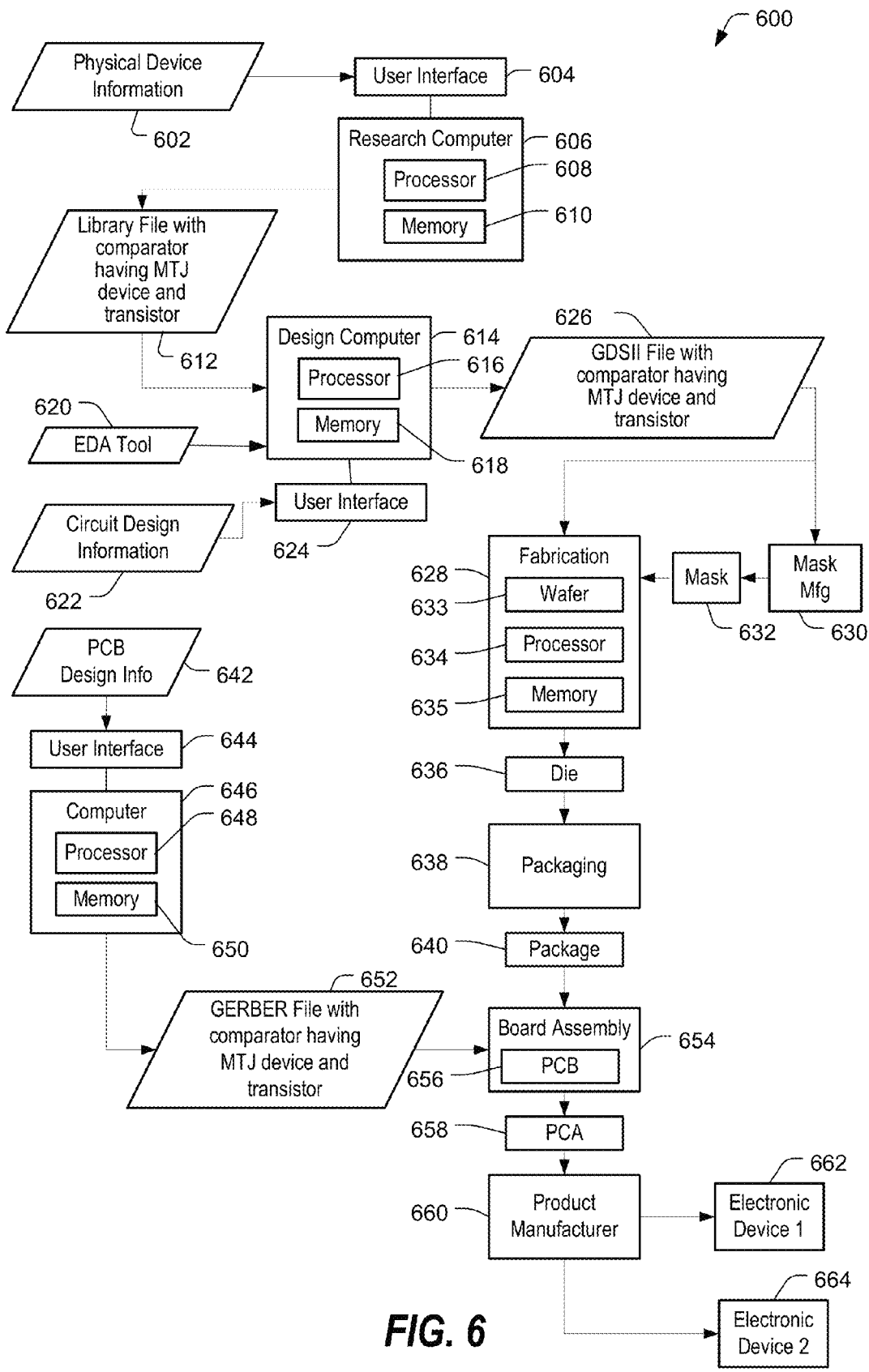
FIG. 6 is a data flow diagram of a particular illustrative embodiment of a manufacturing process to manufacture electronic devices that include a comparator that includes an MTJ device and a transistor.

Referring to FIG. 6, a particular illustrative embodiment of an electronic device manufacturing (e.g., fabricating) process is depicted and generally designated 600. Physical device information 602 is received at the manufacturing process 600, such as at a research computer 606. The physical device information 602 may include design information representing at least one physical property of a semiconductor device, such as the comparator 130 of FIG. 1. For example, the physical device information 602 may include physical parameters, material characteristics, and structure information that is entered via a user interface 604 coupled to the research computer 606. The research computer 606 includes a processor 608, such as one or more processing cores, coupled to a computer readable medium (e.g., a non-transitory computer-readable storage medium), such as a memory 610. The memory 610 may store computer readable instructions that are executable to cause the processor 608 to transform the physical device information 602 to comply with a file format and to generate a library file 612.

In a particular embodiment, the library file 612 includes at least one data file including the transformed design information. For example, the library file 612 may include a library of semiconductor devices including a device that includes the comparator 130 of FIG. 1, that is provided for use with an electronic design automation (EDA) tool 620.

The library file 612 may be used in conjunction with the EDA tool 620 at a design computer 614 including a processor 616, such as one or more processing cores, coupled to a memory 618. The EDA tool 620 may be stored as processor executable instructions at the memory 618 to enable a user of the design computer 614 to design a circuit including the comparator 130 of FIG. 1 of the library file 612. For example, a user of the design computer 614 may enter circuit design information 622 via a user interface 624 coupled to the design computer 614. The circuit design information 622 may include design information representing at least one physical property of a semiconductor device, such as the comparator 130 of FIG. 1. To illustrate, the circuit design property may include identification of particular circuits and relationships to other elements in a circuit design, positioning information, feature size information, interconnection information, or other information representing a physical property of a semiconductor device.

The design computer 614 may be configured to transform the design information, including the circuit design information 622, to comply with a file format. To illustrate, the file format may include a database binary file format representing planar geometric shapes, text labels, and other information about a circuit layout in a hierarchical format, such as a Graphic Data System (GDSII) file format. The design computer 614 may be configured to generate a data file including the transformed design information, such as a GDSII file 626 that includes information describing the comparator 130 of FIG. 1 in addition to other circuits or information. To illustrate, the data file may include information corresponding to a system-on-chip (SOC) that includes the comparator 130 of FIG. 1, and that also includes additional electronic circuits and components within the SOC.

The GDSII file 626 may be received at a fabrication process 628 to fabricate the comparator 130 of FIG. 1 according to transformed information in the GDSII file 626. For example, a device manufacturing process may include providing the GDSII file 626 to a mask manufacturer 630 to create one or more masks, such as masks to be used with photolithography processing, illustrated as a representative mask 632. The mask 632 may be used during the fabrication process to generate one or more wafers 633, which may be tested and separated into dies, such as a representative die 636. The die 636 includes a circuit including a device that includes the comparator 130 of FIG. 1.

For example, the fabrication process 628 may include a processor 634 and a memory 635 to initiate and/or control the fabrication process 628. The memory 635 may include executable instructions such as computer-readable instructions or processor-readable instructions. The executable instructions may include one or more instructions that are executable by a computer such as the processor 634.

The fabrication process 628 may be implemented by a fabrication system that is fully automated or partially automated. For example, the fabrication process 628 may be automated according to a schedule. The fabrication system may include fabrication equipment (e.g., processing tools) to perform one or more operations to form a semiconductor device. For example, the fabrication equipment may be configured to deposit one or more materials using chemical vapor deposition (CVD) and/or physical vapor deposition (PVD), pattern materials using a single-mask or multi-mask litho-etch process (e.g., two-mask LELE), pattern materials using a litho-freeze-litho-etch (LFLE) process, pattern materials using a self-aligned double patterning (SADP) process, epitaxially grow one or more materials, conformally deposit one or more materials, apply a hardmask, apply an etching mask, perform etching, perform planarization, form a dummy gate stack, form a gate stack, perform a standard clean 1 type, etc. In a particular embodiment, the fabrication process 628 corresponds to a semiconductor manufacturing process associated with a technology node smaller than 14 nm (e.g., 10 nm, 7 nm, etc.). The specific process or combination of processes used to manufacture a device (e.g., including the comparator 130 of FIG. 1 may be based on design constraints and available materials/equipment. Thus, in particular embodiments, different processes may be used than described with reference to FIGS. 1-6 during manufacture of the device.

As an illustrative example, a two-mask LELE process used during Via1 formation for the comparator 130 of FIG. 1 may include using a first photoresist mask to form a first pattern on a first layer (e.g., a nitride layer) of a device and etching the first pattern. A second mask may then be used to form a second pattern on the device and the combined pattern may be etched down to a second, lower layer (e.g., an oxide layer) of the device. In the combined pattern, features (e.g., lines) of the first pattern and the second pattern may be interleaved. The combined pattern may thus have smaller feature (e.g., line) pitch as compared to the first pattern and the second pattern.

As another illustrative example, a SADP process used to pattern an M1 or M2 layer of the comparator 130 of FIG. 1 may include forming a "dummy" pattern on a device. A conforming dielectric layer may be formed (e.g., deposited) over the dummy pattern and may be etched. During etching, all of the dielectric layer except "spacers" of dielectric material adjacent to sidewalls of the dummy pattern may be removed. The dummy pattern may then be removed (e.g., without etching), leaving behind the spacers, which may form a pattern that has higher feature (e.g., line) density than the dummy pattern. The higher-density spacer pattern may be used to pattern the M1 or M2 layer.

The fabrication system (e.g., an automated system that performs the fabrication process 628) may have a distributed architecture (e.g., a hierarchy). For example, the fabrication system may include one or more processors, such as the processor 634, one or more memories, such as the memory 635, and/or controllers that are distributed according to the distributed architecture. The distributed architecture may include a high-level processor that controls or initiates operations of one or more low-level systems. For example, a high-level portion of the fabrication process 628 may include one or more processors, such as the processor 634, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the particular high-level. Each of the one or more low-level systems may be associated with one or more corresponding pieces of fabrication equipment (e.g., processing tools). In a particular embodiment, the fabrication system may include multiple processors that are distributed in the fabrication system. For example, a controller of a low-level system component may include a processor, such as the processor 634.

Alternatively, the processor 634 may be a part of a high-level system, subsystem, or component of the fabrication system. In another embodiment, the processor 634 includes distributed processing at various levels and components of a fabrication system.

The executable instructions included in the memory 635 may enable the processor 634 to form (or initiate formation of) the comparator 130 of FIG. 1. In a particular embodiment, the memory 635 is a non-transitory computer-readable medium storing computer-executable instructions that are executable by the processor 634 to cause the processor 634 to initiate formation of a device. For example, the computer executable instructions may be executable to cause the processor 634 to initiate formation of the comparator 130 of FIG. 1.

The die 636 may be provided to a packaging process 638 where the die 636 is incorporated into a representative package 640. For example, the package 640 may include the single die 636 or multiple dies, such as a system-in-package (SiP) arrangement. The package 640 may be configured to conform to one or more standards or specifications, such as Joint Electron Device Engineering Council (JEDEC) standards.

Information regarding the package 640 may be distributed to various product designers, such as via a component library stored at a computer 646. The computer 646 may include a processor 648, such as one or more processing cores, coupled to a memory 650. A printed circuit board (PCB) tool may be stored as processor executable instructions at the memory 650 to process PCB design information 642 received from a user of the computer 646 via a user interface 644. The PCB design information 642 may include physical positioning information of a packaged semiconductor device on a circuit board, the packaged semiconductor device corresponding to the package 640 including the comparator 130 of FIG. 1, or any combination thereof.

The computer 646 may be configured to transform the PCB design information 642 to generate a data file, such as a GERBER file 652 with data that includes physical positioning information of a packaged semiconductor device on a circuit board, as well as layout of electrical connections such as traces and vias, where the packaged semiconductor device corresponds to the package 640 including the comparator 130 of FIG. 1. In other embodiments, the data file generated by the transformed PCB design information may have a format other than a GERBER format.

The GERBER file 652 may be received at a board assembly process 654 and used to create PCBs, such as a representative PCB 656, manufactured in accordance with the design information stored within the GERBER file 652. For example, the GERBER file 652 may be uploaded to one or more machines to perform various steps of a PCB production process. The PCB 656 may be populated with electronic components including the package 640 to form a representative printed circuit assembly (PCA) 658.

The PCA 658 may be received at a product manufacturing process 660 and integrated into one or more electronic devices, such as a first representative electronic device 662 and a second representative electronic device 664. For example, the first representative electronic device 662, the second representative electronic device 664, or both, may include or correspond to the wireless communication device 500 of FIG. 5. As an illustrative, non-limiting example, the first representative electronic device 662, the second representative electronic device 664, or both, may include a communications device, a fixed location data unit, a mobile location data unit, a mobile phone, a cellular phone, a satellite phone, a computer, a tablet, a portable computer, or a desktop computer. Alternatively or additionally, the first representative electronic device 662, the second representative electronic device 664, or both, may include a computing device, a mobile device, a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof, into which the into which the comparator 130 of FIG. 1 is integrated.

As another illustrative, non-limiting example, one or more of the electronic devices 662 and 664 may include remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 6 illustrates remote units according to teachings of the disclosure, the disclosure is not limited to these illustrated units. Embodiments of the disclosure may be suitably employed in any device which includes active integrated circuitry including memory and on-chip circuitry. For example, one or more of the electronic device 662 and 664 may include cars, trucks, airplanes, boats, other vehicles, or appliances, such as refrigerators, microwaves, washing machines, security systems, other appliances, or a combination thereof. In a particular embodiment, one or more of the electronic device 662 and 664 may utilize memory and/or wireless communication.

A device that includes the comparator 130 may be fabricated, processed, and incorporated into an electronic device, as described in the illustrative process 600. One or more aspects of the embodiments disclosed with respect to FIG. 1-5 may be included at various processing stages, such as within the library file 612, the GDSII file 626 (e.g., a file having a GDSII format), and the GERBER file 652 (e.g., a file having a GERBER format), as well as stored at the memory 610 of the research computer 606, the memory 618 of the design computer 614, the memory 650 of the computer 646, the memory of one or more other computers or processors (not shown) used at the various stages, such as at the board assembly process 654, and also incorporated into one or more other physical embodiments such as the mask 632, the die 636, the package 640, the PCA 658, other products such as prototype circuits or devices (not shown), or any combination thereof. Although various representative stages of production from a physical device design to a final product are depicted, in other embodiments fewer stages may be used or additional stages may be included. Similarly, the process 600 may be performed by a single entity or by one or more entities performing various stages of the process 600.

Although one or more of FIGS. 1-6 may illustrate systems, devices, and/or methods according to the teachings of the disclosure, the disclosure is not limited to these illustrated systems, devices, and/or methods. Embodiments of the disclosure may be suitably employed in any device that includes integrated circuitry including memory, a processor, and on-chip circuitry.

One or more functions or components of any of FIGS. 1-6 as illustrated or described herein may be combined with one or more other portions of another of FIGS. 1-6. Accordingly, no single embodiment described herein should be construed as limiting and embodiments of the disclosure may be suitably combined without departing form the teachings of the disclosure.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal. A storage device is not a signal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:
1. An apparatus comprising:
a magnetic tunnel junction (MTJ) device configured to switch between having a first magnetic orientation corresponding to a first resistance and having a second magnetic orientation corresponding to a second resistance based on a received input voltage;

a field line proximate to the MTJ device, the field line comprising a flux concentrating layer and configured to:
tune a comparator switching point of the MTJ device to a first comparator switching point value responsive to a first amount of current applied to the field line; and
tune the comparator switching point of the MTJ device to a second comparator switching point value responsive to a second amount of current applied to the field line; and
a transistor including a gate,
wherein an output of the MTJ device is coupled to a resistor and to the gate of the transistor, and wherein the MTJ device, the resistor, and the transistor are included in a comparator.

2. The apparatus of claim 1, further comprising a processor and a memory that includes a memory cell, the comparator coupled between the processor and the memory, wherein the MTJ device, the resistor, and the transistor are external to the memory cell.

3. The apparatus of claim 1, wherein the MTJ device, the resistor, and the transistor are external to a memory cell of a memory, and further comprising a wireless controller and an antenna, wherein the comparator is coupled between the wireless controller and the antenna.

4. The apparatus of claim 1, wherein the first comparator switching point value of the MTJ device corresponds to a first threshold voltage level, and wherein a second comparator switching point value of the MTJ device corresponds to a second threshold voltage level distinct from the first threshold voltage level.

5. The apparatus of claim 1, wherein the MTJ device is configured to switch between providing a first voltage at the output of the MTJ device and providing a second voltage at the output of the MTJ device in response to the input voltage, and wherein first voltage and the second voltage are each higher than the input voltage.

6. The apparatus of claim 1, wherein the MTJ device includes a free layer that is configured to switch from having the first magnetic orientation to having the second magnetic orientation based on the input voltage being greater than a first threshold voltage level, and wherein the MTJ device is configured to transition from the first resistance to the second resistance in response to the input voltage being less than a second threshold voltage.

7. The apparatus of claim 1, further comprising a load circuit having a voltage supply connected in series with a load, wherein a comparator output of a first terminal of the transistor is connected to the voltage supply and wherein a second terminal of the transistor is connected via the load to the voltage supply.

8. The apparatus of claim 5, wherein the MTJ device is configured to switch from generating the first voltage at the output of the MTJ device to generating the second voltage at the output of the MTJ device based on the input voltage being less than a second threshold voltage level, and wherein the second threshold voltage level corresponds to the second comparator switching point value of the MTJ device.

9. The apparatus of claim 1, wherein the transistor comprises a metal-oxide semiconductor (MOS) transistor or a bipolar junction transistor (BJT).

10. The apparatus of claim 1, wherein the comparator is coupled to a diode bridge circuit, a second comparator, or a combination thereof, and wherein the second comparator includes a second MTJ device and a second transistor.

11. The apparatus of claim 1, further comprising:
the resistor;
a voltage supply coupled to a drain of the transistor; and
a load coupled to a source of the transistor.

12. The apparatus of claim 1, further comprising:
a processor that includes the comparator;
a wireless controller coupled to the processor; and
an antenna coupled to the processor via the wireless controller, wherein the processor, the wireless controller, and the antenna are included in a mobile communication device.

13. A method of operation of a comparator, the method comprising:
at a device comprising the comparator including a magnetic tunnel junction (MTJ) device having an output coupled to a resistor and to a gate of a transistor, performing:
adjusting a comparator switching point of the MTJ device to a first comparator switching point value responsive to a first amount of current applied to a field line proximate to the MTJ device;
switching from outputting a first voltage to outputting a second voltage when a third voltage applied to an input of the comparator increases above a first threshold voltage level, wherein the first threshold voltage level corresponds to a first comparator switching point value of the MTJ device;
adjusting the comparator switching point of the MTJ device to a second comparator switching point value responsive to a second amount of current applied to the field line; and
switching from outputting the second voltage to outputting the first voltage when the third voltage applied to the input decreases below a second threshold voltage level, wherein the second threshold voltage level corresponds to a second comparator switching point value of the MTJ device.

14. The method of claim 13, wherein the first threshold voltage level is lower than the second threshold voltage level.

15. A method of operation of a comparator, the method comprising:
adjusting the comparator switching point of a magnetic tunnel junction (MTJ) device of the comparator to a first comparator switching point value responsive to a first amount of current applied to a field line proximate to the MTJ device;
switching, by the MTJ device, from providing a first particular voltage at an output of the MTJ device to providing a second particular voltage at the output in response to a voltage applied to an input of the MTJ device exceeding a first threshold voltage level, the first threshold voltage level corresponding to a first comparator switching point value of the MTJ device;
adjusting the comparator switching point of the MTJ device to a second comparator switching point value responsive to a second amount of current applied to the field line; and
switching, by the MTJ device, from providing the second particular voltage at the output to providing the first particular voltage at the output in response to the voltage applied to the input decreasing below a second threshold voltage level, the second threshold voltage level corresponding to a second comparator switching point value of the MTJ device.

16. The method of claim 15, further comprising outputting a first voltage at a second output of a transistor coupled to the output in response to the first particular voltage is applied to a gate of the transistor, and wherein the first voltage is higher than the voltage applied to the input.

17. The method of claim 15, further comprising applying an amount of current to the field line proximate to the MTJ device, wherein the first threshold voltage level and the second threshold voltage level correspond to a first threshold voltage level pair, and wherein the current establishes a second threshold voltage level pair associated with operation of the MTJ device, the second threshold voltage level pair distinct from the first threshold voltage level pair.

18. The method of claim 15, further comprising outputting a third voltage at a second output of a transistor coupled to the output in response to the second particular voltage being applied to a gate of the transistor.

19. The method of claim 18, wherein the second particular voltage is greater than the voltage applied to the input.

20. The method of claim 18, wherein the second particular voltage corresponds to a second logical value.

21. An apparatus comprising:
means for comparing an input voltage to a threshold voltage, the means for comparing including a magnetic tunnel junction (MTJ) device and a transistor, wherein the means for comparing has a hysteresis property associated with multiple transition points that correspond to magnetic switching points of the MTJ device, and wherein an output of the MTJ device is coupled to means for activating a channel region of the transistor and to a resistor; and
means for tuning the magnetic switching points of the MTJ device, the means for tuning configured to:
tune a means for comparing switching point of the MTJ device to a first means for comparing switching point value responsive to a first amount of current applied to the means for tuning; and
tune the means for comparing switching point of the MTJ device to a second means for comparing switching point value responsive to a second amount of current applied to the means for tuning,
the magnetic switching points adjustable to tune the MTJ from operation based on a first threshold voltage level pair to operation based on a second threshold voltage level pair,
wherein at least a portion of the means for tuning is included in the means for comparing.

22. The apparatus of claim 21, wherein the means for comparing and the means for tuning are integrated into at least one of a computing device, a mobile device, a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, or a portable digital video player.

23. The apparatus of claim 22, wherein the means for comparing is configured to produce a first output voltage that corresponds to a first comparator switching point value of the MTJ device and to produce a second output voltage that corresponds to a second comparator switching point value of the MTJ device.

24. The apparatus of claim 1, wherein a resistance of the MTJ device is configured to transition from a first value to a second value in response to the input voltage exceeding a first threshold voltage.

25. The apparatus of claim 2, wherein the comparator is configured to produce a first output voltage that corresponds to the first comparator switching point value of the MTJ device, and wherein the comparator is configured to produce a second output voltage that corresponds to the second comparator switching point value of the MTJ device.

26. The apparatus of claim 3, wherein the first comparator switching point value of the MTJ device and the second comparator switching point value of the MTJ device correspond to a first pair of output voltages, and wherein, in response to an amount of current, the first comparator switching point value of the MTJ device and the second comparator switching point value of the MTJ device correspond to a second pair of output voltages.

27. The apparatus of claim 1, wherein at least a portion of the field line is included in the comparator.

28. The apparatus of claim 25, wherein the transistor includes an output configured to produce the first output voltage at a first time and to produce the second output voltage at a second time.

29. The apparatus of claim 28, wherein the first output voltage is greater than the input voltage, and wherein the second output voltage is greater than the input voltage.

30. The apparatus of claim 28, wherein the first output voltage corresponds to a first logical value, and wherein the second output voltage corresponds to a second logical value.

* * * * *